United States Patent
Kim et al.

(10) Patent No.: US 11,313,882 B2
(45) Date of Patent: Apr. 26, 2022

(54) BATTERY MANAGEMENT SYSTEM, BATTERY PACK INCLUDING SAME, AND METHOD FOR DETERMINING FAILURE IN CURRENT DETECTING CIRCUIT

(71) Applicant: LG Chem, Ltd., Seoul (KR)

(72) Inventors: Young-Ho Kim, Daejeon (KR); Min-Soo Choi, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 16/764,020

(22) PCT Filed: Jun. 28, 2019

(86) PCT No.: PCT/KR2019/007909
§ 371 (c)(1),
(2) Date: May 14, 2020

(87) PCT Pub. No.: WO2020/005020
PCT Pub. Date: Jan. 2, 2020

(65) Prior Publication Data
US 2020/0333377 A1    Oct. 22, 2020

(30) Foreign Application Priority Data
Jun. 29, 2018  (KR) .................. 10-2018-0075763

(51) Int. Cl.
*G01R 1/20*  (2006.01)
*G01R 31/3842*  (2019.01)
(Continued)

(52) U.S. Cl.
CPC ....... *G01R 1/203* (2013.01); *G01R 19/16571* (2013.01); *G01R 31/28* (2013.01);
(Continued)

(58) Field of Classification Search
CPC ............. G01R 1/203; G01R 31/3842; G01R 19/16571; G01R 31/28; G01R 31/382;
(Continued)

(56) References Cited

U.S. PATENT DOCUMENTS

| 6,031,302 A * | 2/2000 | Levesque ............ H02J 7/0031 307/130 |
| 2005/0134228 A1* | 6/2005 | Elder ............... H01M 10/4257 320/134 |

(Continued)

FOREIGN PATENT DOCUMENTS

| CN | 104836271 A | 8/2015 |
| CN | 106154178 A | 11/2016 |

(Continued)

OTHER PUBLICATIONS

Seunghyeong Lee, Yongjae Jeong, Yungwi Song and Jongsun Kim, "A single chip Li-Ion battery protection IC with low standby mode auto release," 2014 International SoC Design Conference (ISOCC), 2014, pp. 38-39 (Year: 2014).*

(Continued)

*Primary Examiner* — Daniel R Miller
(74) *Attorney, Agent, or Firm* — Lerner, David, Littenberg, Krumholz & Mentlik, LLP

(57) ABSTRACT

A battery management system, a battery pack including same and a method for determining a failure in a current detecting circuit. The system includes the current detecting circuit configured to detect a reference current representing a current flowing through a high current path of the battery pack, a bidirectional switch including a charging FET and a discharging FET installed on the high current path, and a control unit. The control unit detects a first voltage across the charging FET and a second voltage across the discharging FET while a first high level voltage is applied to a gate of the charging FET and a second high level voltage is applied to (Continued)

a gate of the discharging FET. The control unit determines a failure in the current detecting circuit based on at least one of the first voltage and the second voltage and the reference current.

14 Claims, 7 Drawing Sheets

(51) Int. Cl.
  *G01R 31/28* (2006.01)
  *H01M 10/48* (2006.01)
  *H03K 17/0812* (2006.01)
  *H01M 10/42* (2006.01)
  *H02J 7/00* (2006.01)
  *G01R 19/165* (2006.01)

(52) U.S. Cl.
  CPC ........ *G01R 31/3842* (2019.01); *H01M 10/48* (2013.01); *H02J 7/00304* (2020.01); *H03K 17/08122* (2013.01); *H01M 2010/4271* (2013.01)

(58) Field of Classification Search
  CPC . G01R 19/0092; G01R 35/00; H02J 7/00304; H01M 10/48; H01M 2010/4271; H03K 17/08122; Y02E 60/10
  See application file for complete search history.

(56) References Cited

U.S. PATENT DOCUMENTS

| | | | | |
|---|---|---|---|---|
| 2005/0156574 A1* | 7/2005 | Sato | ............ | H02J 7/00306 320/134 |
| 2006/0152234 A1 | 7/2006 | Miller | | |
| 2008/0278116 A1* | 11/2008 | Matsunaga | ............ | H03K 17/063 320/134 |
| 2009/0132188 A1 | 5/2009 | Watanabe | | |
| 2009/0295334 A1 | 12/2009 | Yang et al. | | |
| 2011/0133571 A1 | 6/2011 | Kiyohara et al. | | |
| 2012/0096298 A1* | 4/2012 | Noda | ............ | H01M 10/482 713/340 |
| 2012/0229945 A1* | 9/2012 | Sakurai | ............ | H02H 3/08 361/86 |
| 2012/0262151 A1* | 10/2012 | Mandic | ............ | G01R 19/25 324/113 |
| 2012/0274335 A1 | 11/2012 | Matsuura | | |
| 2012/0313574 A1* | 12/2012 | Maetani | ............ | H02J 7/008 320/107 |
| 2013/0134942 A1* | 5/2013 | Sakurai | ............ | H01M 10/486 320/118 |
| 2013/0328530 A1 | 12/2013 | Beaston | | |
| 2015/0229144 A1* | 8/2015 | Jang | ............ | H02J 7/0021 320/134 |
| 2015/0331057 A1 | 11/2015 | Imaizumi | | |
| 2016/0322840 A1 | 11/2016 | Maetani | | |
| 2017/0003353 A1 | 1/2017 | Seo | | |
| 2017/0040646 A1 | 2/2017 | Beaston | | |
| 2018/0024196 A1 | 1/2018 | Imura et al. | | |
| 2018/0045783 A1 | 2/2018 | Wu et al. | | |
| 2019/0260198 A1 | 8/2019 | Sonehara et al. | | |

FOREIGN PATENT DOCUMENTS

| | | |
|---|---|---|
| CN | 106849212 A | 6/2017 |
| CN | 107112744 A | 8/2017 |
| EP | 2911267 A1 | 8/2015 |
| EP | 3115800 A1 | 1/2017 |
| EP | 3324196 A1 | 5/2018 |
| JP | 2007195351 A | 8/2007 |
| JP | 2015220856 A | 12/2015 |
| KR | 101042768 B1 | 6/2011 |
| KR | 101264428 B1 | 5/2013 |
| KR | 20160129747 A | 11/2016 |
| KR | 20170004499 A | 1/2017 |
| KR | 101810658 B1 | 12/2017 |
| KR | 20180018451 A | 2/2018 |
| WO | 2018016225 A1 | 1/2018 |

OTHER PUBLICATIONS

International Search Report for Application No. PCT/KR2019/007909, dated Oct. 31, 2019, pp. 1-2.

Extended European Search Report including Written Opinion for Application No. 19825877.4 dated Mar. 25, 2021, pp. 1-9.

Search Report for Chinese Application No. 201980005711.9 dated Nov. 2, 2021. 2 pgs.

\* cited by examiner

BATTERY MANAGEMENT SYSTEM, BATTERY PACK INCLUDING SAME, AND METHOD FOR DETERMINING FAILURE IN CURRENT DETECTING CIRCUIT

CROSS-REFERENCE TO RELATED APPLICATIONS

The present application is a national phase entry under 35 U.S.C. § 371 of International Application No. PCT/KR2019/007909 filed Jun. 28, 2019, published in Korean, which claims priority from Korean Patent Application No. 10-2018-0075763 filed Jun. 29, 2018, all of which are incorporated herein by reference.

TECHNICAL FIELD

The present disclosure relates to a battery management system for determining a failure in a current detecting circuit, a battery pack including the same and a method for determining a failure in the current detecting circuit.

The present application claims the benefit of Korean Patent Application No. 10-2018-0075763 filed on Jun. 29, 2018 with the Korean Intellectual Property Office, the disclosure of which is incorporated herein by reference in its entirety.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages of freely charging and discharging, a very low self-discharge rate and high energy density.

A current detecting circuit is installed on a high current path of a battery pack to detect the charging/discharging current flowing through the battery. The charging/discharging current is a basic and important parameter essentially required to calculate the state of charge (SOC) and the state of health (SOH) of the battery. Accordingly, it is necessary to measure the charging/discharging current as accurately as possible.

In general, the current detecting circuit has a shunt resistor, and detects the charging/discharging current by dividing the measured voltage across the shunt resistor when the charging/discharging current flows through the shunt resistor by the resistance of the shunt resistor.

However, a hardware or software failure (e.g., damage in the shunt resistor and the communication line) of the current detecting circuit may occur due to many causes, and in this case, the charging/discharging current detected by the current detecting circuit is not reliable. Accordingly, there is a need for technology to properly detect a failure in the current detecting circuit having the shunt resistor.

Patent Literature 1 determines a failure in a current detecting circuit by comparing the charging/discharging current detected using a shunt resistor with the charging/discharging current detected using a hall sensor.

However, Patent Literature 1 essentially including a hall sensor requires a higher manufacturing cost and is more complex than a circuit that detects the charging/discharging current using a shunt resistor alone.

(Patent Literature 1) Korean Patent No. 10-1810658 (registered on Dec. 13, 2017)

SUMMARY

Technical Problem

The present disclosure is designed to solve the above-described problem, and therefore the present disclosure is directed to providing a battery management system for determining a failure in a current detecting circuit having a shunt resistor with no need to add a hall sensor for detecting the charging/discharging current, and a battery pack including the same and a method for determining a failure in a current detecting circuit.

These and other objects and advantages of the present disclosure may be understood by the following description and will be apparent from the embodiments of the present disclosure. Additionally, it will be readily understood that the objects and advantages of the present disclosure may be realized by the means set forth in the appended claims and their combination.

Technical Solution

A battery management system according to an embodiment of the present disclosure includes a current detecting circuit having a shunt resistor installed on a high current path of a battery pack, and configured to detect a reference current representing a current flowing through the high current path, a bidirectional switch including a charging field effect transistor (FET) and a discharging FET connected in series and installed on the high current path, and a control unit operably coupled to the current detecting circuit and the bidirectional switch. The control unit detects a first voltage across the charging FET and a second voltage across the discharging FET while a first high level voltage is applied to a gate of the charging FET and a second high level voltage is applied to a gate of the discharging FET. The control unit is configured to determine a failure in the current detecting circuit based on at least one of the first voltage and the second voltage and the reference current detected by the current detecting circuit.

The control unit may acquire an on-state resistance associated with a drain current corresponding to the reference current as a first reference resistance from a first lookup table associated with the first high level voltage by using the reference current as an index when the first high level voltage is equal to the second high level voltage. The first lookup table has data indicating a relationship between drain current and on-state resistance of the charging FET and the discharging FET when the first high level voltage is applied as a gate voltage. The control unit may calculate a first current by dividing any one of the first voltage and the second voltage by the first reference resistance. The control unit may be configured to determine the failure in the current detecting circuit based on a difference between the reference current and the first current.

The control unit may acquire an on-state resistance associated with a drain current corresponding to the reference current as a first reference resistance from a first lookup table associated with the first high level voltage by using the reference current as an index when the first high level voltage and the second high level voltage are different from each other. The first lookup table has data indicating a relationship between drain current and on-state resistance of the charging FET and the discharging FET when the first high level voltage is applied as a gate voltage. The control unit may acquire an on-state resistance associated with a drain current corresponding to the reference current as a second reference resistance from a second lookup table associated with the second high level voltage by using the reference current as an index when the first high level voltage and the second high level voltage are different from each other. The second lookup table has data indicating a relationship between drain current and on-state resistance of the charging FET and the discharging FET when the second high level voltage is applied as a gate voltage. The control unit may calculate a first current by dividing the first voltage by the first reference resistance. The control unit may calculate a second current by dividing the second voltage by the second reference resistance. The control unit may be configured to determine a failure in the current detecting circuit based on a difference between the first current and the second current.

The control unit may acquire a drain-source voltage associated with a drain current corresponding to the reference current as a first reference voltage from a third lookup table associated with the first high level voltage by using the reference current as an index when the first high level voltage is equal to the second high level voltage. The third lookup table has data indicating a relationship between the drain current and the drain-source voltage of the charging FET and the discharging FET when the first high level voltage is applied as a gate voltage. The control unit may be configured to determine the failure in the current detecting circuit based on a difference between the first voltage and the first reference voltage.

The control unit may acquire a drain-source voltage associated with a drain current corresponding to the reference current as a first reference voltage from a third lookup table associated with the first high level voltage by using the reference current as an index when the first high level voltage and the second high level voltage are different from each other. The third lookup table has data indicating a relationship between drain current and drain-source voltage of the charging FET and the discharging FET when the first high level voltage is applied as a gate voltage. The control unit may acquire a drain-source voltage associated with a drain current corresponding to the reference current as a second reference voltage from a fourth lookup table associated with the second high level voltage by using the reference current as an index when the first high level voltage and the second high level voltage are different from each other. The fourth lookup table has data indicating a relationship between drain current and drain-source voltage of the charging FET and the discharging FET when the second high level voltage is applied as a gate voltage. The control unit may be configured to determine the failure in the current detecting circuit based on a difference between a sum of the first voltage and the second voltage and a sum of the first reference voltage and the second reference voltage.

The control unit may determine the failure in the current detecting circuit based on the second voltage and the reference current when the reference current is outside of a preset current range and the first high level voltage is larger than the second high level voltage. The control unit may be configured to determine the failure in the current detecting circuit based on the first voltage and the reference current when the reference current is outside of the current range and the first high level voltage is smaller than the second high level voltage.

The control unit may be configured to determine that at least one of the first voltage and the second voltage is invalid when the first high level voltage is larger than the second high level voltage and the first voltage is larger than the second voltage.

The control unit may be configured to determine that at least one of the first voltage and the second voltage is invalid when the first high level voltage is smaller than the second high level voltage and the first voltage is smaller than the second voltage.

The control unit may be configured to determine that at least one of the first voltage and the second voltage is invalid when the first high level voltage is equal to the second high level voltage, a difference between the first voltage and the second voltage is outside of a preset voltage range.

The control unit may be configured to output a diagnosis signal indicating a result of the determination.

A battery pack according to another embodiment of the present disclosure includes a battery management system according to any of the embodiments described herein.

A method according to still another embodiment of the present disclosure is for determining a failure in a current detecting circuit. The method includes applying a first high level voltage and a second high level voltage between a gate and a source of a charging FET and between a gate and a source of a discharging FET respectively, the charging FET and the discharging FET being connected in series to a high current path of a battery pack, detecting a reference current representing a current flowing through the high current path based on a voltage across a shunt resistor installed on the high current path while the first high level voltage is applied to the gate of the charging FET and the second high level voltage is applied to the gate of the discharging FET, determining a first voltage across the charging FET and a second voltage across the discharging FET, and determining the failure in the current detecting circuit based on at least one of the first voltage and the second voltage and the reference current.

The step of determining the failure in the current detecting circuit based on at least one of the first voltage and the second voltage and the reference current may include acquiring an on-state resistance associated with a drain current corresponding to the reference current from a first lookup table associated with the first high level voltage as a first reference resistance by using the reference current as an index when the first high level voltage and the second high level voltage are different from each other, acquiring an on-state resistance associated with a drain current corresponding to the reference current from a second lookup table associated with the second high level voltage as a second reference resistance by using the reference current as an index when the first high level voltage and the second high level voltage are different from each other, calculating a first current by dividing the first voltage by the first reference resistance, calculating a second current by dividing the second voltage by the second reference resistance, and determining the failure in the current detecting circuit based on a difference between the first current and the second current. The first lookup table has data indicating a relationship between drain current and on-state resistance of the charging FET and the discharging FET when the first high level voltage is applied as a gate-source voltage. The second lookup table has data indicating a relationship between drain current and on-state resistance of the charging FET and the discharging FET when the second high level voltage is applied as a gate-source voltage.

The step of determining the failure in the current detecting circuit based on at least one of the first voltage and the second voltage and the reference current may include acquiring a drain-source voltage associated with a drain current corresponding to the reference current from a third lookup table associated with the first high level voltage as a first reference voltage by using the reference current as an index when the first high level voltage and the second high level voltage are different from each other, acquiring a drain-source voltage associated with a drain current corresponding to the reference current from a fourth lookup table associated with the second high level voltage as a second reference voltage by using the reference current as an index when the first high level voltage and the second high level voltage are different from each other, and determining the failure in the current detecting circuit based on a difference between a sum of the first voltage and the second voltage and a sum of the first reference voltage and the second reference voltage. The third lookup table has data indicating a relationship between drain current and drain-source voltage of the charging FET and the discharging FET when the first high level voltage is applied as a gate voltage. The fourth lookup table has data indicating a relationship between drain current and drain-source voltage of the charging FET and the discharging FET when the second high level voltage is applied as a gate voltage.

Advantageous Effects

According to at least one of the embodiments of the present disclosure, it is possible to determine a failure in a current detecting circuit having a shunt resistor with no need to add a hall sensor for detecting the charging/discharging current.

The effects of the present disclosure are not limited to the effects mentioned above, and other effects will be clearly understood by those skilled in the art from the appended claims.

BRIEF DESCRIPTION OF THE DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

DETAILED DESCRIPTION

Figure 1:
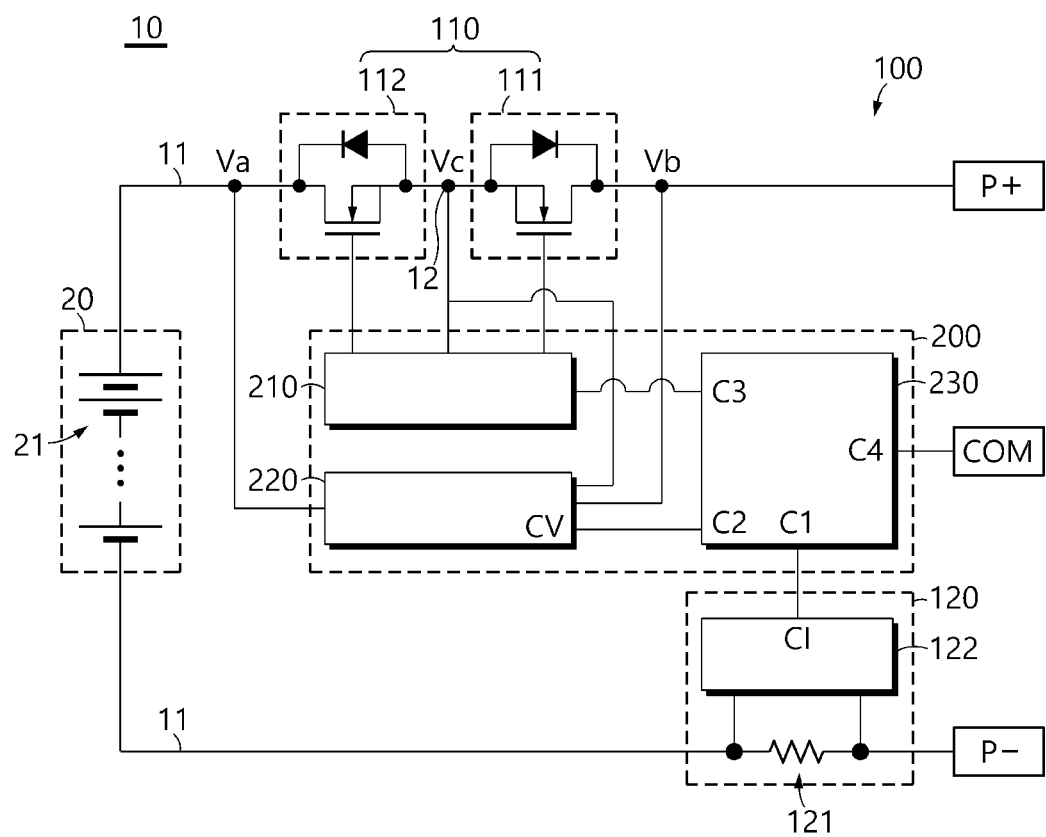
FIG. 1 is a schematic diagram of a battery pack including a battery management system according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general or dictionary meanings, but interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

The terms including the ordinal number such as "first", "second" and the like, are used to distinguish one element from another among various elements, but not intended to limit the elements by the terms.

Unless the context clearly indicates otherwise, it will be understood that the term "comprises" or "includes" when used in this specification, specifies the presence of stated elements, but does not preclude the presence or addition of one or more other elements.

In addition, throughout the specification, it will be further understood that when an element is referred to as being "connected to" another element, it can be directly connected to the other element or intervening elements may be present.

Figure 2:
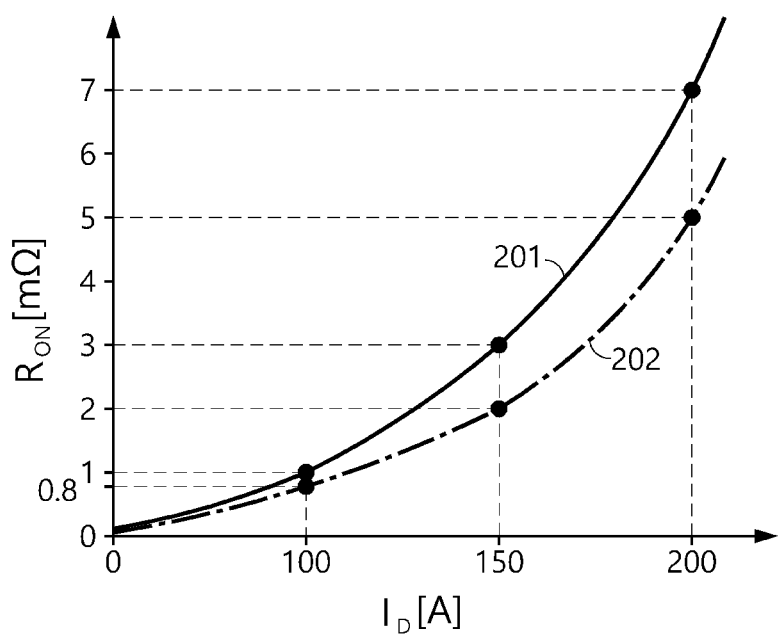
FIG. 2 is an exemplary diagram showing a graph for reference in describing a first lookup table and a second lookup table used to determine a failure in a current detecting circuit of FIG. 1.
Figure 3:
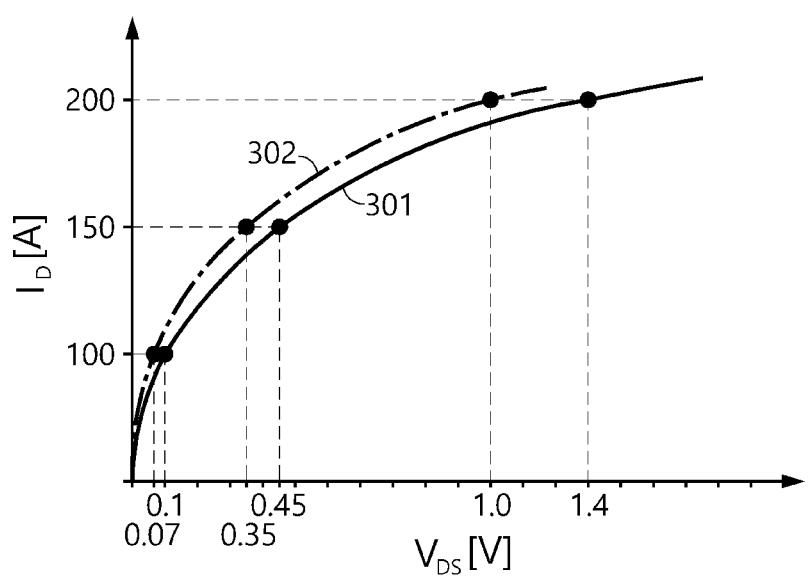
FIG. 3 is an exemplary diagram showing a graph for reference in describing a third lookup table and a fourth lookup table used to determine a failure in a current detecting circuit of FIG. 1.

FIG. 1 is a schematic diagram of a battery pack 10 including a battery management system 100 according to an embodiment of the present disclosure, FIG. 2 is an exemplary diagram showing a graph for reference in describing a first lookup table and a second lookup table used to determine a failure in a current detecting circuit 120 of FIG. 1, and FIG. 3 is an exemplary diagram showing a graph for reference in describing a third lookup table and a fourth lookup table used to determine a failure in the current detecting circuit 120 of FIG. 1.

Referring to FIG. 1, the battery pack 10 includes a battery stack 20 and a battery management system 100.

The battery stack 20 includes at least one battery cell 21. When the battery stack 20 includes a plurality of battery cells 21, each battery cell 21 may be connected to other battery cell 21 in series or in parallel. Each battery cell 21 may be, for example, a lithium ion battery or a lithium polymer battery. Of course, the type of the battery cell 21 is not limited to a lithium ion battery or a lithium polymer battery, and includes any type of battery cell that can be repeatedly recharged, without limitation.

The battery management system 100 includes a bidirectional switch 110, a current detecting circuit 120 and a control unit 200.

The bidirectional switch 110 is installed on a high current path 11. The bidirectional switch 110 may include a charging FET 111 and a discharging FET 112 connected in series. The term of FET stands for a "field effect transistor". The charging FET 111 may include a drain, a gate, a source and a parasitic diode. The discharging FET 112 may include a drain, a gate, a source and a parasitic diode.

For example, as shown in FIG. 1, the drain of the charging FET 111 may be connected to a first power terminal P+ of the battery pack 10, the drain of the discharging FET 112 may be connected to a positive terminal of the battery stack 20, and the source of the charging FET 111 and the source of the discharging FET 112 may be connected to a common node 12 on the high current path 11.

In another example, as opposed to those shown in FIG. 1, the positions of the charging FET 111 and the discharging FET 112 may be exchanged. That is, the source of the charging FET 111 may be connected to the positive terminal of the battery stack 20, the source of the discharging FET 112 may be connected to the first power terminal P+ of the battery pack 10, and the drain of the charging FET 111 and the drain of the discharging FET 112 may be connected to the common node 12.

The drain, the gate and the source of the charging FET 111 and the drain, the gate and the source of the discharging FET 112 are connected to the control unit 200. A high level voltage selectively outputted from the control unit 200 is applied between the gate and the source of the charging FET 111 or between the gate and the source of the discharging FET 112. Each of the charging FET 111 and the discharging FET 112 operates in an on state while the high level voltage is outputted from the control unit 200, and operates in an off state when the output of the high level voltage from the control unit 200 stops.

The parasitic diode of the charging FET 111 is connected between the drain and the source of the charging FET 111. While the charging FET 111 has the off state, the charging current is interrupted by the parasitic diode of the charging FET 111. The parasitic diode of the discharging FET 112 is connected between the drain and the source of the discharging FET 112. While the discharging FET 112 has the off state, the discharging current is interrupted by the parasitic diode of the discharging FET 112.

The current detecting circuit 120 includes a shunt resistor 121 and a microprocessor 122. The shunt resistor 121 is installed on the high current path 11 of the battery pack 10. For example, as shown in FIG. 1, one end of the shunt resistor 121 may be connected to a negative terminal of the battery stack 20, and the other end may be connected to a second power terminal P− of the battery pack 10. Of course, as opposed to those shown in FIG. 1, one end of the shunt resistor 121 may be connected to the positive terminal of the battery stack 20, and the other end may be connected to the drain of the discharging FET 112. Alternatively, one end of the shunt resistor 121 may be connected to the drain of the charging FET 111, and the other end may be connected to the first power terminal P+. The microprocessor 122 may detect the charging/discharging current flowing through the high current path 11 in a predetermined cycle (e.g., 0.01 sec) by dividing the voltage across the shunt resistor 121 by the resistance of the shunt resistor 121. Hereinafter, the charging/discharging current detected by the current detecting circuit 120 is referred to as 'reference current'. The microprocessor 122 has a communication terminal CI. The microprocessor 122 outputs current data indicating the reference current to the control unit 200 through the communication terminal CI.

The control unit 200 is operably coupled to the current detecting circuit 120 and the bidirectional switch 110. The control unit 200 includes a switch driver 210, a voltage detecting circuit 220 and a controller 230.

The switch driver 210 is configured to selectively shift the bidirectional switch 110 from the on state to the off state or from the off state to the on state in response to an on command or off command from the controller 230. In detail, the switch driver 210 selectively controls each of the charging FET 111 and the discharging FET 112 into the on state by selectively applying the high level voltage between the gate and the source of at least one of the charging FET 111 and the discharging FET 112. For example, in a general mode in which the high level voltage is applied to both the gate of the charging FET 111 and the gate of the discharging FET 112, both the charging FET 111 and the discharging FET 112 have the on state, and thus the charging current and the discharging current may flow through the high current path 11. In another example, in a charge mode in which the high level voltage is only applied to the gate of the charging FET 111, the charging FET 111 has the on state and the discharging FET 112 has the off state, and thus the discharging current is interrupted and only the charging current may flow through the high current path 11. On the contrary, in a discharge mode in which the high level voltage is only applied to the gate of the discharging FET 112, the charging FET 111 has the off state and the discharging FET 112 has the on state, and thus the charging current is interrupted and only the discharging current may flow through the high current path 11.

The switch driver 210 may be configured to apply a plurality of preset high level voltages (e.g., 5.0 V, 5.5 V, 6.0 V) as gate-source voltage of the charging FET 111 and the discharging FET 112. That is, the switch driver 210 may apply any one of the plurality of high level voltages (e.g., 5.0 V, 5.5 V, 6.0 V) to the gate of the charging FET 111 as the gate-source voltage, and may apply any one of the plurality of high level voltages (e.g., 5.0 V, 5.5 V, 6.0 V) to the gate of the discharging FET 112 as the gate-source voltage. Accordingly, the high level voltage applied between the gate and the source of the charging FET 111 may be equal to or different from the high level voltage applied to the gate and the source of the discharging FET 112. Hereinafter, the high level voltage applied to the gate of the charging FET 111 is referred to as 'first high level voltage', and the high level voltage applied to the gate of the discharging FET 112 is referred to as 'second high level voltage'.

The voltage detecting circuit 220 is configured to detect each of voltage Va of the battery stack 20 and voltage Vb of the first power terminal P+. The voltage detecting circuit 220 may be further configured to detect voltage Vc of the common node 12. The voltage detecting circuit 220 has a communication terminal CV. The voltage detecting circuit 220 outputs voltage data indicating at least one of the voltage Va of the battery stack 20, the voltage Vb of the first power terminal P+ and the voltage Vc of the common node 12 to the controller 230 through the communication terminal CV.

The controller 230 is operably coupled to each of the current detecting circuit 120, the switch driver 210 and the voltage detecting circuit 220. The controller 230 has a communication terminal C1, a communication terminal C2, a communication terminal C3 and a communication terminal C4. The controller 230 may keep monitoring time-dependent changes of the reference current based on the current data from the current detecting circuit 120 received through the communication terminal C1. Here, the reference current corresponds to the current measured by the current detecting circuit 120. The controller 230 may keep monitoring time-dependent changes of at least one of the voltage of the battery stack 20, the voltage of the first power terminal P+ and the voltage of the common node 12, based on the voltage data from the voltage detecting circuit 220 received through the communication terminal C2. The controller 230 outputs the on command or the off command to the switch driver 210 through the communication terminal C3.

The controller 230 may be implemented, in hardware, including at least one of application specific integrated circuits (ASICs), digital signal processors (DSPs), digital signal processing devices (DSPDs), programmable logic devices (PLDs), field programmable gate arrays (FPGAs), microprocessors, and electrical units for performing other functions. Additionally, a memory device may be embedded in the controller 230, and the memory device may include, for example, RAM, ROM, register, hard disk, an optical recording medium or a magnetic recording medium. The memory device may store, update and/or erase programs including various types of control logics that are executed by the controller 230, and/or data created when the control logics are executed.

The controller 230 may monitor voltage across each of the charging FET 111 and the discharging FET 112 based on the voltage data. The voltage across the charging FET 111 is a voltage between the drain and the source of the charging FET 111 (i.e., drain-source voltage). The voltage across the discharging FET 112 is a voltage between the drain and the source of the discharging FET 112. Accordingly, the voltage across the charging FET 111 corresponds to a difference between the voltage Vb of the first power terminal P+ and the voltage of Vc of the common node 12, and the voltage across the discharging FET 112 corresponds to a difference between the voltage Va of the battery stack 20 and the voltage Vc of the common node 12. Hereinafter, the drain-source voltage of the charging FET 111 and the drain-source voltage of the discharging FET 112 generated while the first high level voltage is applied to the gate of the charging FET 111 and the second high level voltage is applied to the gate of the discharging FET 112 are referred to as 'first voltage' and 'second voltage' respectively.

When a predetermined condition is satisfied, the controller 230 may determine a failure in the current detecting circuit 120 based on at least one of the first voltage and the second voltage and the reference current detected by the current detecting circuit 120. That is, when the predetermined condition is satisfied, the controller 230 may determine whether the reference current detected by the current detecting circuit 120 validly represents the charging/discharging current flowing through the high current path 11. The predetermined condition is that an amount of change in the reference current for a unit time (e.g., 0.1 sec) monitored lately is outside of a reference range (e.g., −50~+50 A).

When the amount of change in the reference current for the unit time is outside of the reference range, the controller 230 may determine a monitoring period based on the amount of change in the reference current for the unit time. The monitoring period may be proportional to the amount of change in the reference current for the unit time. For example, when the amount of change in the reference current for the unit time is 100 A, the monitoring period of time may be determined to be 2 sec, and when the amount of change in the reference current for the unit time is 150 A, the monitoring period of time may be determined to be 3 sec. A failure in the current detecting circuit 120 may be periodically determined for the monitoring period at a predetermined time interval (e.g., 0.2 sec).

The time point in which the voltage across the shunt resistor 121 is detected by the current detecting circuit 120 and the time point in which the first voltage and the second voltage are detected by the voltage detecting circuit 220 may have only a difference within a preset error range. The controller 230 may diagnose a failure in the current detecting circuit 120 using at least one of a plurality of lookup tables pre-stored in the memory device, and each diagnosis operation will be described in more detail below. Each lookup table is associated with any one of the plurality of high level voltages that may be used as the gate-source voltage of the charging FET 111 and the discharging FET 112.

When a difference between the first voltage and the second voltage is outside of a preset threshold voltage range while the first high level voltage is equal to the second high level voltage, the controller 230 may determine that at least one of the first voltage and the second voltage is invalid, and in other cases, the controller 230 may determine that both the first voltage and the second voltage are valid.

When the first voltage is larger than the second voltage while the first high level voltage is larger than the second high level voltage, the controller 230 may determine that at least one of the first voltage and the second voltage is invalid, and in other cases, the controller 230 may determine that both the first voltage and the second voltage are valid.

When the first voltage is smaller than the second voltage in case that the first high level voltage is smaller than the second high level voltage, the controller 230 may determine that at least one of the first voltage and the second voltage is invalid, and in other cases, the controller 230 may determine that both the first voltage and the second voltage are valid.

Only when both the first voltage and the second voltage are determined to be valid, the controller 230 may determine a failure in the current detecting circuit 120.

<Diagnosis Operation Using at Least One of First Lookup Table and Second Lookup Table>

In FIG. 2, a curve 201 shows a relationship between drain current $I_D$ and on-state resistance $R_{ON}$ of the FETs 111, 112 when the high level voltage (e.g., 5.0 V) is applied as the gate-source voltage of the FETs 111, 112, and a curve 202 shows a relationship between drain current $I_D$ and on-state resistance $R_{ON}$ of the FETs 111, 112 when the high level voltage (e.g., 6.0 V) is applied as the gate-source voltage of the FETs 111, 112.

Referring to FIGS. 1 and 2, the memory device of the controller 230 may pre-store at least one of a first lookup table and a second lookup table. The first lookup table is associated with one (e.g., 5.0 V) of the plurality of high level voltages, and has data corresponding to the curve 201. The second lookup table is associated with the other one (e.g., 6.0 V) of the plurality of high level voltages, and has data corresponding to the curve 202.

As can be seen through the curves 201 and 202 shown in FIG. 2, while the high level voltage (e.g., 5.0 V, 6.0 V) is applied as the gate-source voltage of the FETs 111, 112, with the increasing drain current ID of the FETs 111, 112, the on-state resistance $R_{ON}$ of the FETs 111, 112 non-linearly increases. Of course, while the high level voltage (e.g., 5.0 V, 6.0 V) is applied as the gate-source voltage of the FETs 111, 112, with the decreasing drain current $I_D$ of the FETs 111, 112, the on-state resistance $R_{ON}$ of the FETs 111, 112 non-linearly reduces. Additionally, as the gate-source voltage of the FETs 111, 112 increases, the on-state resistance $R_{ON}$ of the FETs 111, 112 reduces.

The controller 230 may acquire a first reference resistance associated with the reference current from the first lookup table by using the reference current as an index. For example, referring to the curve 201, when the reference current is 100 A, the on-state resistance of 1 mΩ associated with the drain current of 100 A may be acquired as the first reference resistance, when the reference current is 150 A, the on-state resistance of 3 mΩ associated with the drain current of 150 A may be acquired as the first reference resistance, and when the reference current is 200 A, the on-state resistance of 7 mΩ associated with the drain current of 200 A may be acquired as the first reference resistance. The controller 230 may calculate a first current by dividing the first voltage by the first reference resistance.

The controller 230 may acquire a second reference resistance associated with the reference current from the second lookup table by using the reference current as an index. For example, referring to the curve 202, when the reference current is 100 A, the on-state resistance of 0.8 mΩ associated with the drain current of 100 A may be acquired as the second reference resistance, when the reference current is 150 A, the on-state resistance of 2 mΩ associated with the drain current of 150 A may be acquired as the second reference resistance, and when the reference current is 200 A, the on-state resistance of 5 mΩ associated with the drain current of 200 A may be acquired as the second reference resistance. The controller 230 may calculate a second current by dividing the second voltage by the second reference resistance.

Meanwhile, the gate-source voltage of the charging FET 111 may be equal to the gate-source voltage of the discharging FET 112. That is, the first high level voltage may be equal to the second high level voltage. In this case, the first voltage is equal to the second voltage, and the first reference resistance is equal to the second reference resistance. Accordingly, when the first high level voltage is equal to the second high level voltage, the controller 230 may calculate only one of the first current and the second current.

On the contrary, the gate-source voltage of the charging FET 111 and the gate-source voltage of the discharging FET 112 may be different from each other. That is, the first high level voltage and the second high level voltage may be unequal to each other. In this case, the first voltage and the second voltage are different from each other, and the first reference resistance and the second reference resistance are also different from each other. Accordingly, when the first high level voltage and the second high level voltage are different from each other, the controller 230 may calculate both the first current and the second current.

The controller 230 may determine a failure in the current detecting circuit 120 based on a difference between the reference current and the first current. The reference current and the first current indicate the charging/discharging current flowing through the high current path 11 at the same time point. Accordingly, if the current detecting circuit 120 is normal, a difference between the reference current and the first current will be within a preset first current range (e.g., −0.3 A~+0.3 A), but if the current detecting circuit 120 is faulty, a difference between the reference current and the first current will be outside of the first current range.

Likewise, the controller 230 may determine a failure in the current detecting circuit 120 based on a difference between the reference current and the second current. The reference current and the second current indicate the charging/discharging current flowing through the high current path 11 at the same time point. Accordingly, if the current detecting circuit 120 is normal, a difference between the reference current and the second current will be within the first current range, but if the current detecting circuit 120 is faulty, a difference between the reference current and the first current will be outside of the first current range.

Alternatively, the controller 230 may determine a failure in the current detecting circuit 120 based on a difference between the first current and the second current. The first current and the second current indicate the charging/discharging current flowing through the high current path 11 at the same time point. Accordingly, if the current detecting circuit 120 is normal, a difference between the first current and the second current will be within a preset second current range, but if the current detecting circuit 120 is faulty, a difference between the first current and the second current will be outside of the second current range. The second current range may be equal to or different from the first current range.

<Diagnosis Operation Using at Least One of Third Lookup Table and Fourth Lookup Table>

In FIG. 3, a curve 301 shows a relationship between drain current ID and drain-source voltage VDS of the FETs 111, 112 when the high level voltage (e.g., 5.0 V) is applied as the gate-source voltage of the FETs 111, 112, and a curve 302 shows a relationship between drain current ID and drain-source voltage $V_{DS}$ of the FETs 111, 112 when the high level voltage (e.g., 6.0 V) is applied as the gate-source voltage of the FETs 111, 112.

Referring to FIGS. 1 and 3, the memory device of the controller 230 may pre-store at least one of a third lookup table and a fourth lookup table. The third lookup table is associated with one (e.g., 5.0 V) of the plurality of high level voltages, and has data corresponding to the curve 301. The fourth lookup table is associated with the other one (e.g., 6.0 V) of the plurality of high level voltages, and has data corresponding to the curve 302.

As can be seen through the curves 301 and 302 shown in FIG. 3, while the high level voltage (e.g., 5.0 V, 6.0 V) is applied as the gate-source voltage of the FETs 111, 112, with the increasing drain current ID of the FETs 111, 112, the drain-source voltage $V_{DS}$ of the FETs 111, 112 non-linearly increases. Of course, while the high level voltage (e.g., 5.0 V, 6.0 V) is applied as the gate-source voltage of the FETs 111, 112, with the decreasing drain current ID of the FETs 111, 112, the drain-source voltage $V_{DS}$ of the FETs 111, 112 non-linearly reduces. Additionally, as the gate-source voltage of the FETs 111, 112 increases, the drain-source voltage $V_{DS}$ of the FETs 111, 112 reduces.

The controller 230 may acquire a first reference voltage associated with the reference current from the third lookup table by using the reference current as an index. For example, referring to the curve 301, when the reference current is 100 A, the drain-source voltage of 0.1 V associated with the drain current of 100 A may be acquired as the first reference voltage, when the reference current is 150 A, the drain-source voltage of 0.45 V associated with the drain current of 150 A may be acquired as the first reference voltage, and when the reference current is 200 A, the drain-source voltage of 1.4 V associated with the drain current of 200 A may be acquired as the first reference voltage.

The controller 230 may acquire a second reference voltage associated with the reference current from the fourth lookup table by using the reference current as an index. For example, referring to the curve 302, when the reference current is 100 A, the drain-source voltage of 0.07 V associated with the drain current of 100 A may be acquired as the second reference voltage, when the reference current is 150 A, the drain-source voltage of 0.35 V associated with the drain current of 150 A may be acquired as the second reference voltage, and when the reference current is 200 A, the drain-source voltage of 1.0 V associated with the drain current of 200 A may be acquired as the second reference voltage.

Meanwhile, when the first high level voltage is equal to the second high level voltage, the first voltage is equal to the second voltage. Accordingly, when the first high level voltage is equal to the second high level voltage, the controller 230 may acquire only one of the first reference voltage and the second reference voltage.

On the contrary, when the first high level voltage and the second high level voltage are different from each other, the first voltage and the second voltage may be different from each other. Accordingly, the controller 230 may acquire both the first reference voltage and the second reference voltage when the first high level voltage and the second high level voltage are different from each other.

The controller 230 determines a failure in the current detecting circuit 120 based on a difference between the first voltage and the first reference voltage. The first voltage is generated by the charging/discharging current, and the reference current corresponds to the charging/discharging current. Accordingly, if the current detecting circuit 120 is normal, a difference between the first voltage and the first reference voltage will be within a preset first voltage range (e.g., −0.01 V~+0.01 V), but when the current detecting circuit 120 is faulty, a difference between the first voltage and the first reference voltage will be outside of the first voltage range.

Likewise, the controller 230 determines a failure in the current detecting circuit 120 based on a difference between the second voltage and the second reference voltage. The second voltage is generated by the charging/discharging current, and the reference current corresponds to the charging/discharging current. Accordingly, if the current detecting circuit 120 is normal, a difference between the second voltage and the second reference voltage will be within the first voltage range, but if the current detecting circuit 120 is faulty, a difference between the second voltage and the second reference voltage will be outside of the first voltage range.

Alternatively, the controller 230 determines a failure in the current detecting circuit 120 based on a difference between a sum of the first voltage and the second voltage and a sum of the first reference voltage and the second reference voltage. Each of the first voltage and the second voltage is generated by the charging/discharging current, and the reference current corresponds to the charging/discharging current. Accordingly, when the current detecting circuit 120 is normal, a difference between the sum of the first voltage and the second voltage and the sum of the first reference voltage and the second reference voltage is within the second voltage range, and when the current detecting circuit 120 is faulty, a difference between the sum of the first voltage and the second voltage and the sum of the first reference voltage and the second reference voltage is outside of the second voltage range. The second voltage range may be equal to the first voltage range, or may be broader than the first voltage range, covering the first voltage range.

When the diagnosis operation using at least one of the first lookup table, the second lookup table, the third lookup table and the fourth lookup table as described above is completed, the controller 230 outputs a diagnosis signal indicating a failure in the current detecting circuit 120. The diagnosis signal may be outputted from the communication terminal C4 provided in the controller 230, and transmitted to an external device (e.g., for example, an electronic control unit (ECU) of a vehicle) through a communication terminal COM of the battery pack 10. The communication terminal COM supports wired or wireless communication. The wired communication may be, for example, controller area network (CAN) communication, the wireless communication may be, for example, ZigBee or Bluetooth communication, and the communication protocol is not limited to a particular type and includes any type of communication protocol supporting wired/wireless communication between the controller 230 and the external device.

The external device may a peripheral device configured to provide a user with at least one of video information and audio information corresponding to the diagnosis signal received from the controller 230. The peripheral device may be implemented using devices that output information visually and/or audibly, such as, for example, a display and a speaker.

Figure 4:
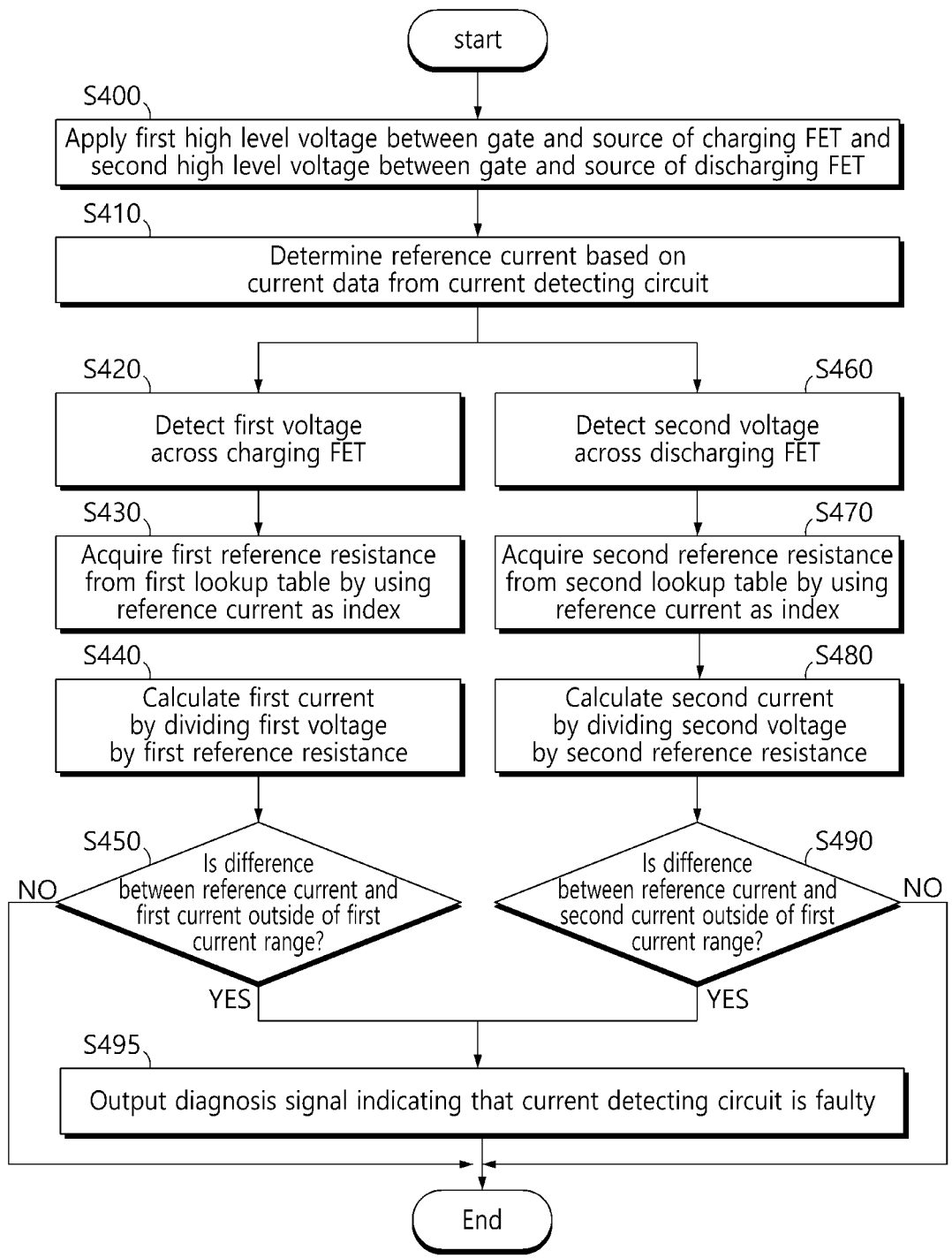
FIG. 4 is a flowchart showing a method for determining a failure in a current detecting circuit according to another embodiment of the present disclosure.

FIG. 4 is a flowchart showing a method for determining a failure in the current detecting circuit 120 according to another embodiment of the present disclosure.

Referring to FIGS. 1, 2 and 4, in step 400, the control unit 200 applies the first high level voltage and the second high level voltage between the gate and the source of the charging FET 111 and the discharging FET 112 respectively. That is, the first high level voltage is applied between the gate and the source of the charging FET 111, and the second high level voltage is applied between the gate and the source of the discharging FET 112. The first high level voltage may be equal to or different from the second high level voltage.

In step 410, the control unit 200 detects the reference current based on the current data from the current detecting circuit 120. The current detecting circuit 120 may detect the reference current based on the voltage across the shunt resistor 121 installed on the high current path 11 of the battery pack 10, and transmit the current data indicating the detected reference current to the control unit 200.

In step 420, the control unit 200 detects the first voltage across the charging FET 111.

In step 430, the control unit 200 acquires the on-state resistance associated with the drain current corresponding to the reference current as the first reference resistance from the first lookup table by using the reference current as an index. The first lookup table has data indicating a relationship between drain current $I_D$ and on-state resistance $R_{ON}$ of the FETs 111, 112 when the first high level voltage is applied as the gate-source voltage of the FETs 111, 112.

In step 440, the control unit 200 calculates the first current by dividing the first voltage by the first reference resistance. The first current is an estimated current flowing through the charging FET 111 and the discharging FET 112.

In step 450, the control unit 200 determines whether a difference between the reference current and the first current is outside of the first current range. A difference between the reference current and the first current outside of the first current range indicates that the current detecting circuit 120 is faulty. When a value of the step 450 is "YES", step 495 is performed.

In step 460, the control unit 200 detects the second voltage across the discharging FET 112.

In step 470, the control unit 200 acquires the on-state resistance associated with the drain current corresponding to the reference current as the second reference resistance from the second lookup table by using the reference current as an index. The second lookup table has data indicating a relationship between drain current $I_D$ and on-state resistance $R_{ON}$ of the FETs 111, 112 when the second high level voltage is applied as the gate-source voltage of the FETs 111, 112.

In step 480, the control unit 200 calculates the second current by dividing the second voltage by the second reference resistance. The second current is an estimated current flowing through the charging FET 111 and the discharging FET 112.

In step 490, the control unit 200 determines whether a difference between the reference current and the second current is outside of the first current range. A difference between the reference current and the first current outside of the first current range indicates that the current detecting circuit 120 is faulty. When a value of the step 490 is "YES", step 495 is performed.

In step 495, the control unit 200 outputs a diagnosis signal indicating that the current detecting circuit 120 is faulty.

Meanwhile, the control unit 200 may perform only one of the process including the steps 420, 430, 440 and 450 and the process including the steps 460, 470, 480 and 490.

Figure 5:
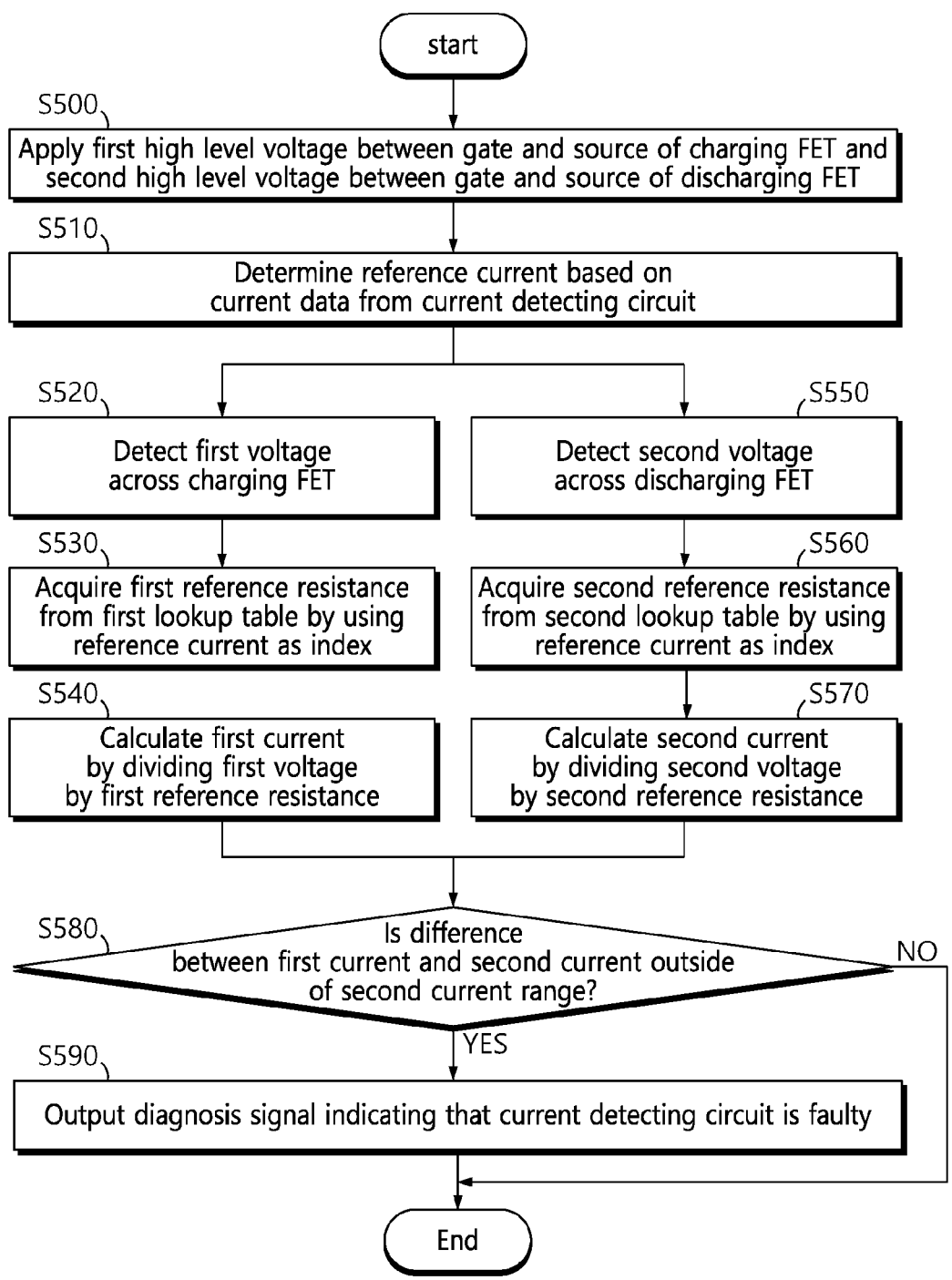
FIG. 5 is a flowchart showing a method for determining a failure in a current detecting circuit according to still another embodiment of the present disclosure.

FIG. 5 is a flowchart showing a method for determining a failure in the current detecting circuit 120 according to still another embodiment of the present disclosure.

Referring to FIGS. 1, 2 and 5, in step 500, the control unit 200 applies the first high level voltage and the second high level voltage between the gate and the source of the charging FET 111 and the discharging FET 112 respectively. That is, the first high level voltage is applied between the gate and the source of the charging FET 111, and the second high level voltage is applied between the gate and the source of the discharging FET 112. The first high level voltage and the second high level voltage are different from each other.

In step 510, the control unit 200 detects the reference current based on the current data from the current detecting circuit 120. The current detecting circuit 120 may detect the reference current based on the voltage across the shunt resistor 121 installed on the high current path 11 of the battery pack 10, and transmit the current data indicating the detected reference current to the control unit 200.

In step 520, the control unit 200 detects the first voltage across the charging FET 111.

In step 530, the control unit 200 acquires the on-state resistance associated with the drain current corresponding to the reference current as the first reference resistance from the first lookup table by using the reference current as an index. The first lookup table has data indicating a relationship between drain current $I_D$ and on-state resistance $R_{ON}$ of the FETs 111, 112 when the first high level voltage is applied as the gate-source voltage of the FETs 111, 112.

In step 540, the control unit 200 calculates the first current by dividing the first voltage by the first reference resistance. The first current is an estimated current flowing through the charging FET 111 and the discharging FET 112.

In step 550, the control unit 200 detects the second voltage across the discharging FET 112.

In step 560, the control unit 200 acquires the on-state resistance associated with the drain current corresponding to the reference current as the second reference resistance from the second lookup table by using the reference current as an index. The second lookup table has data indicating a relationship between drain current ID and on-state resistance $R_{ON}$ of the FETs 111, 112 when the second high level voltage is applied as the gate-source voltage of the FETs 111, 112.

In step 570, the control unit 200 calculates the second current by dividing the second voltage by the second reference resistance. The second current is an estimated current flowing through the charging FET 111 and the discharging FET 112.

In step 580, the control unit 200 determines whether a difference between the first current and the second current is outside of the second current range. A difference between the first current and the second current outside of the second current range indicates that the current detecting circuit 120 is faulty. When a value of the step 580 is "YES", step 590 is performed.

In step 590, the control unit 200 outputs a diagnosis signal indicating that the current detecting circuit 120 is faulty.

Figure 6:
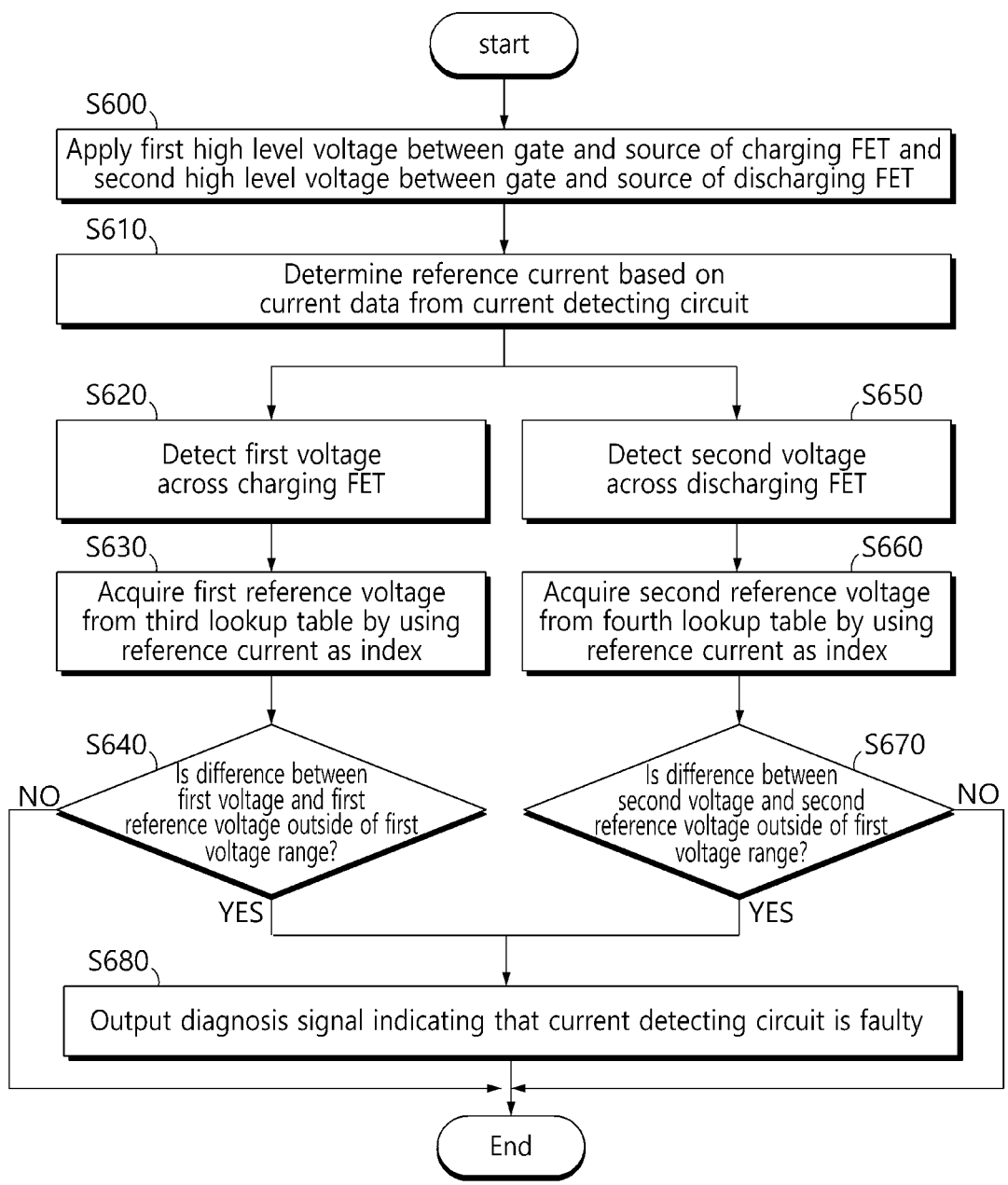
FIG. 6 is a flowchart showing a method for determining a failure in a current detecting circuit according to further another embodiment of the present disclosure.

FIG. 6 is a flowchart showing a method for determining a failure in the current detecting circuit 120 according to further another embodiment of the present disclosure.

Referring to FIGS. 1, 3 and 6, in step 600, the control unit 200 applies the first high level voltage and the second high level voltage between the gate and the source of the charging FET 111 and the discharging FET 112 respectively. That is, the first high level voltage is applied between the gate and the source of the charging FET 111, and the second high level voltage is applied between the gate and the source of the discharging FET 112. The first high level voltage may be equal to or different from the second high level voltage.

In step 610, the control unit 200 detects the reference current based on the current data from the current detecting circuit 120. The current detecting circuit 120 may detect the reference current based on the voltage across the shunt resistor 121 installed on the high current path 11 of the battery pack 10, and transmit the current data indicating the detected reference current to the control unit 200.

In step 620, the control unit 200 detects the first voltage across the charging FET 111.

In step 630, the control unit 200 acquires the drain-source voltage associated with the drain current corresponding to the reference current as the first reference voltage from the third lookup table by using the reference current as an index. The third lookup table has data indicating a relationship between drain current $I_D$ and drain-source voltage $V_{DS}$ of the FETs 111, 112 when the first high level voltage is applied as the gate-source voltage of the FETs 111, 112. The first reference voltage is an estimated first voltage generated when the reference current flows through the charging FET 111.

In step 640, the control unit 200 determines whether a difference between the first voltage and the first reference voltage is outside of the first voltage range. A difference between the first voltage and the first reference voltage outside of the first voltage range indicates that the current detecting circuit 120 is faulty. When a value of the step 640 is "YES", step 680 is performed.

In step 650, the control unit 200 detects the second voltage across the discharging FET 112.

In step 660, the control unit 200 acquires the drain-source voltage associated with the drain current corresponding to the reference current as the second reference voltage from the fourth lookup table by using the reference current as an index. The fourth lookup table has data indicating a relationship between drain current $I_D$ and drain-source voltage $V_{DS}$ of the FETs 111, 112 when the second high level voltage is applied as the gate-source voltage of the FETs 111, 112. The second reference voltage is an estimated second voltage generated when the reference current flows through the discharging FET 112.

In step 670, the control unit 200 determines whether a difference between the second voltage and the second reference voltage is outside of the first voltage range. A difference between the second voltage and the second reference voltage outside of the first voltage range indicates that the current detecting circuit 120 is faulty. When a value of the step 670 is "YES", step 680 is performed.

In step 680, the control unit 200 outputs a diagnosis signal indicating that the current detecting circuit 120 is faulty.

Meanwhile, the control unit 200 may perform only one of the process including the steps 620, 630 and 640 and the process including the steps 650, 660 and 670.

Figure 7:
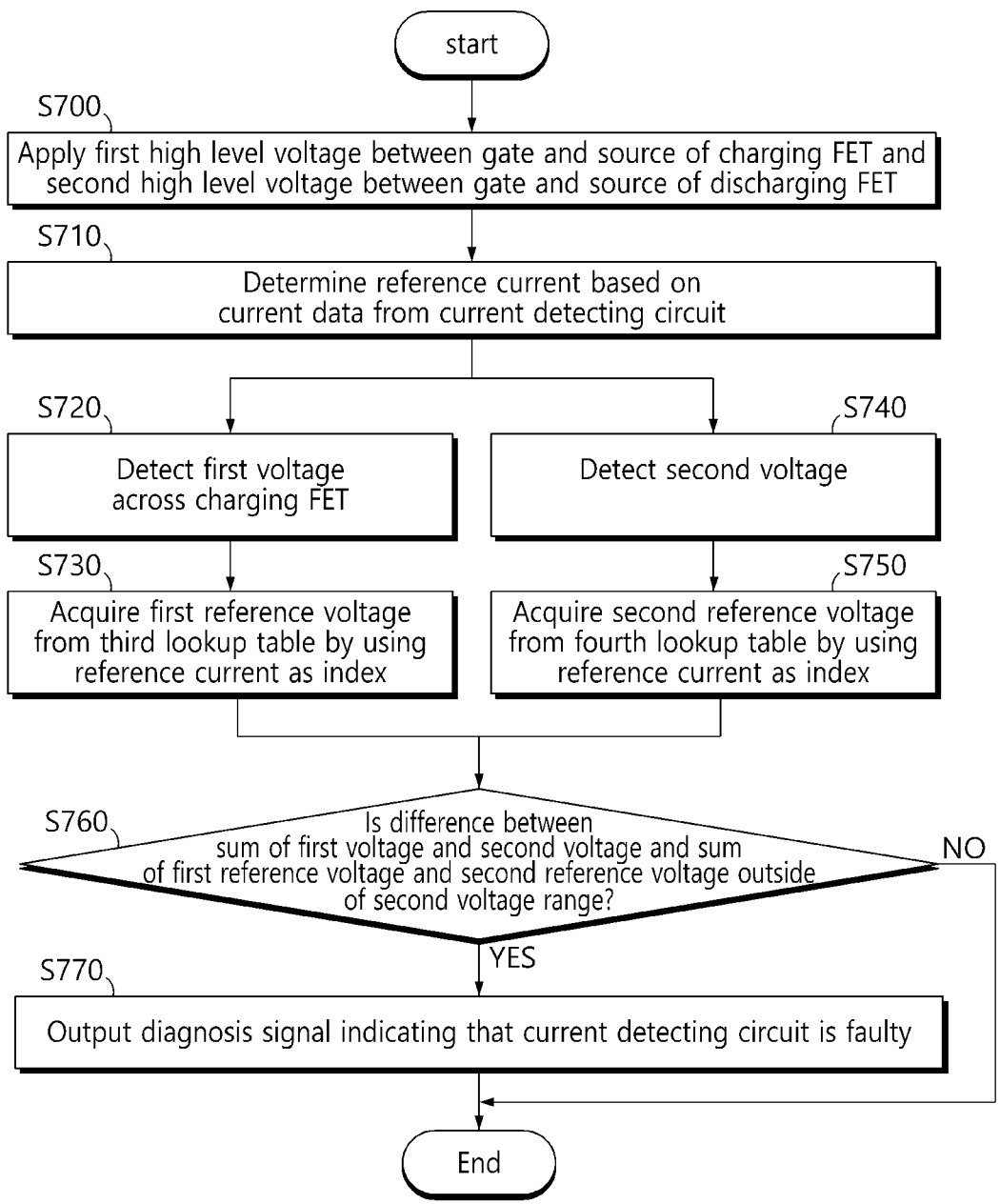
FIG. 7 is a flowchart showing a method for determining a failure in a current detecting circuit according to yet another embodiment of the present disclosure.

FIG. 7 is a flowchart showing a method for determining a failure in the current detecting circuit 120 according to yet another embodiment of the present disclosure.

Referring to FIGS. 1, 3 and 7, in step 700, the control unit 200 applies the first high level voltage and the second high level voltage between the gate and the source of the charging FET 111 and the discharging FET 112 respectively. That is, the first high level voltage is applied between the gate and the source of the charging FET 111, and the second high level voltage is applied between the gate and the source of the discharging FET 112. The first high level voltage and the second high level voltage are different from each other.

In step 710, the control unit 200 detects the reference current based on the current data from the current detecting circuit 120. The current detecting circuit 120 may detect the reference current based on the voltage across the shunt resistor 121 installed on the high current path 11 of the battery pack 10, and transmit the current data indicating the detected reference current to the control unit 200.

In step 720, the control unit 200 detects the first voltage across the charging FET 111.

In step 730, the control unit 200 acquires the drain-source voltage associated with the drain current corresponding to the reference current as the first reference voltage from the third lookup table by using the reference current as an index. The third lookup table has data indicating a relationship between drain current $I_D$ and drain-source voltage $V_{DS}$ of the FETs 111, 112 when the first high level voltage is applied as the gate-source voltage of the FETs 111, 112. The first reference voltage is an estimated first voltage generated when the reference current flows through the charging FET 111.

In step 740, the control unit 200 detects the second voltage across the discharging FET 112.

In step 750, the control unit 200 acquires the drain-source voltage associated with the drain current corresponding to the reference current as the second reference voltage from the fourth lookup table by using the reference current as an index. The fourth lookup table has data indicating a relationship between drain current $I_D$ and drain-source voltage $V_{DS}$ of the FETs 111, 112 when the second high level voltage is applied as the gate-source voltage of the FETs 111, 112. The second reference voltage is an estimated second voltage generated when the reference current flows through the discharging FET 112.

In step 760, the control unit 200 determines whether a difference between the sum of the first voltage and the second voltage and the sum of the first reference voltage and the second reference voltage is outside of the second voltage range. The difference between the sum of the first voltage and the second voltage and the sum of the first reference voltage and the second reference voltage outside of the second voltage range indicates a failure in the current detecting circuit 120. When a value of the step 760 is "YES", step 770 is performed.

In step 770, the control unit 200 outputs a diagnosis signal indicating that the current detecting circuit 120 is faulty.

According to the embodiments of the present disclosure described above, it is possible to determine a failure in the current detecting circuit 120 having the shunt resistor 121 with no need to add a hall sensor for detecting the charging/discharging current.

The embodiments of the present disclosure described hereinabove are not implemented only through the apparatus and method, and may be implemented through programs that realize the functions corresponding to the configurations of the embodiments of the present disclosure or recording media having the programs recorded thereon, and this implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

DESCRIPTION OF REFERENCE NUMERALS

10: Battery pack
11: High current path
12: Common node
20: Battery stack
21: Battery cell
100: Battery management system
110: Bidirectional switch
111: Charging FET
112: Discharging FET
120: Current detecting circuit
121: Shunt resistor
200: Control unit
210: Switch driver
220: Voltage detecting circuit
230: Controller

What is claimed is:

1. A battery management system, comprising:
   a current detecting circuit having a shunt resistor installed on a high current path of a battery pack, and configured to detect a reference current representing a current flowing through the high current path;
   a bidirectional switch including a charging field effect transistor (FET) and a discharging FET connected in series, and installed on the high current path, each of the charging FET and the discharging FET including a respective gate to which a respective high-level voltage is applied; and
   a control unit operably coupled to the current detecting circuit and the bidirectional switch, wherein the control unit is configured to:
   select a lookup table based on a high-level voltage applied to the gate of the charging FET or the discharging FET;

derive a lookup voltage or a lookup current associated with the detected reference current in the lookup table; and determine a failure in the current detecting circuit based on at least one of the lookup voltage or the lookup current.

2. The battery management system according to claim 1, wherein the control unit is configured to, when the respective high level voltages applied to the charging and discharging FETs are the same:

detect a voltage across one of the charging FET or the discharging FET while the high level voltage is applied to its gate;

acquire an on-state resistance associated with a drain current corresponding to the reference current as a reference resistance from the lookup table associated with the high level voltage by using the reference current as an index, wherein the lookup table has data indicating a relationship between drain current and on-state resistance of the charging FET and the discharging FET, calculate the lookup current by dividing the detected voltage by the reference resistance, and determine the failure in the current detecting circuit based on a difference between the reference current and the lookup current.

3. The battery management system according to claim 1, wherein the control unit is configured to, when the respective high level voltages applied to the charging and discharging FETs are different:

detect a first voltage across the charging FET while a first high level voltage is applied to its gate and a second voltage across the discharging FET while a second high level voltage is applied to its gate;

acquire an on-state resistance associated with a drain current corresponding to the reference current as a first reference resistance from a first lookup table associated with the first high level voltage by using the reference current as an index, wherein the first lookup table has data indicating a relationship between drain current and on-state resistance of the charging FET and the discharging FET when the first high level voltage is applied as a gate voltage, acquire an on-state resistance associated with a drain current corresponding to the reference current as a second reference resistance from a second lookup table associated with the second high level voltage by using the reference current as an index, wherein the second lookup table has data indicating a relationship between drain current and on-state resistance of the charging FET and the discharging FET when the second high level voltage is applied as a gate voltage, calculate a first lookup current by dividing the first voltage by the first reference resistance, calculate a second lookup current by dividing the second voltage by the second reference resistance, and determine the failure in the current detecting circuit based on a difference between the first lookup current and the second lookup current.

4. The battery management system according to claim 1, wherein the control unit is configured to, when the respective high level voltages applied to the charging and discharging FETs are the same:

detect a voltage across one of the charging FET or the discharging FET while the high level voltage is applied to its gate;

acquire a drain-source voltage associated with a drain current corresponding to the reference current as a reference voltage from the lookup table associated with the high level voltage by using the reference current as an index, wherein the lookup table has data indicating a relationship between drain current and drain-source voltage of the charging FET and the discharging FET, and determine the failure in the current detecting circuit based on a difference between the detected voltage and the reference voltage.

5. The battery management system according to claim 1, wherein the control unit is configured to, when the respective high level voltages applied to the charging and discharging FETs are different:

detect a first voltage across the charging FET while a first high level voltage is applied to its gate and a second voltage across the discharging FET while a second high level voltage is applied to its gate;

acquire a drain-source voltage associated with a drain current corresponding to the reference current as a first reference voltage from a third lookup table associated with the first high level voltage by using the reference current as an index, wherein the third lookup table has data indicating a relationship between drain current and drain-source voltage of the charging FET and the discharging FET when the first high level voltage is applied as a gate voltage, acquire a drain-source voltage associated with a drain current corresponding to the reference current as a second reference voltage from a fourth lookup table associated with the second high level voltage by using the reference current as an index, wherein the fourth lookup table has data indicating a relationship between drain current and drain-source voltage of the charging FET and the discharging FET when the second high level voltage is applied as a gate voltage, and determine the failure in the current detecting circuit based on a difference between a sum of the first detected voltage and the second detected voltage and a sum of the first reference voltage and the second reference voltage.

6. The battery management system according to claim 1, wherein the control unit is configured to:

detect a first voltage across the charging FET while a first high level voltage is applied to its gate and a second voltage across the discharging FET while a second high level voltage is applied to its gate;

determine the failure in the current detecting circuit based on the second detected voltage and the reference current when the reference current is outside of a preset current range and the first high level voltage is larger than the second high level voltage, and determine the failure in the current detecting circuit based on the first detected voltage and the reference current when the reference current is outside of the preset current range and the first high level voltage is smaller than the second high level voltage.

7. The battery management system according to claim 1, wherein the control unit is configured to:

detect a first voltage across the charging FET while a first high level voltage is applied to its gate and a second voltage across the discharging FET while a second high level voltage is applied to its gate; and determine that at least one of the first detected voltage and the second detected voltage is invalid when the first high level voltage is larger than the second high level voltage and the first detected voltage is larger than the second detected voltage.

8. The battery management system according to claim 1, wherein the control unit is configured to:
   detect a first voltage across the charging FET while a first high level voltage is applied to its gate and a second voltage across the discharging FET while a second high level voltage is applied to its gate; and
   determine that at least one of the first detected voltage and the second detected voltage is invalid when the first high level voltage is smaller than the second high level voltage and the first detected voltage is smaller than the second detected voltage.

9. The battery management system according to claim 1, wherein the control unit is configured to:
   detect a first voltage across the charging FET while a first high level voltage is applied to its gate and a second voltage across the discharging FET while a second high level voltage is applied to its gate; and
   determine that at least one of the first detected voltage and the second detected voltage is invalid when the first high level voltage is equal to the second high level voltage and a difference between the first detected voltage and the second detected voltage is outside of a preset voltage range.

10. The battery management system according to claim 1, wherein the control unit is configured to output a diagnosis signal indicating a result of the determination.

11. A battery pack comprising the battery management system according to claim 1.

12. A method for determining a failure in a current detecting circuit, comprising:
   applying a high level voltage between a gate and a source of one of a charging field effect transistor (FET) for a discharging FET, the charging FET and the discharging FET being connected in series to a high current path of a battery pack;
   selecting, by a control unit, a lookup table based on a high-level voltage applied to the gate of the charging FET or the discharging FET;
   deriving, by the control unit, a lookup voltage or a lookup current associated with the detected reference current in the lookup table;
   determining, by the control unit, the failure in the current detecting circuit based on at least one of the lookup voltage or the lookup current.

13. The method for determining a failure in a current detecting circuit according to claim 12, wherein determining the failure in the current detecting circuit based on at least one of the first voltage and the second voltage and the reference current, comprises, when respective high level voltages applied to the charging and discharging FETs are different:
   detecting a first voltage across the charging FET while a first high level voltage is applied to its gate and a second voltage across the discharging FET while a second high level voltage is applied to its gate;
   acquiring an on-state resistance associated with a drain current corresponding to the reference current from a first lookup table associated with the first high level voltage as a first reference resistance by using the reference current as an index;
   acquiring an on-state resistance associated with a drain current corresponding to the reference current from a second lookup table associated with the second high level voltage as a second reference resistance by using the reference current as an index;
   calculating a first lookup current by dividing the first voltage by the first reference resistance;
   calculating a second lookup current by dividing the second voltage by the second reference resistance; and
   determining the failure in the current detecting circuit based on a difference between the first lookup current and the second lookup current,
   wherein the first lookup table has data indicating a relationship between drain current and on-state resistance of the charging FET and the discharging FET when the first high level voltage is applied as a gate-source voltage, and
   the second lookup table has data indicating a relationship between drain current and on-state resistance of the charging FET and the discharging FET when the second high level voltage is applied as a gate-source voltage.

14. The method for determining a failure in a current detecting circuit according to claim 12, wherein determining the failure in the current detecting circuit based on at least one of the first voltage and the second voltage and the reference current comprises, when the respective high level voltages applied to the charging and discharging FETs are different:
   detecting a first voltage across the charging FET while a first high level voltage is applied to its gate and a second voltage across the discharging FET while a second high level voltage is applied to its gate;
   acquiring a drain-source voltage associated with a drain current corresponding to the reference current from a third lookup table associated with the first high level voltage as a first reference voltage by using the reference current as an index;
   acquiring a drain-source voltage associated with a drain current corresponding to the reference current from a fourth lookup table associated with the second high level voltage as a second reference voltage by using the reference current as an index; and
   determining the failure in the current detecting circuit based on a difference between a sum of the first detected voltage and the second detected voltage and a sum of the first reference voltage and the second reference voltage,
   wherein the third lookup table has data indicating a relationship between drain current and drain-source voltage of the charging FET and the discharging FET when the first high level voltage is applied as a gate voltage, and
   the fourth lookup table has data indicating a relationship between drain current and drain-source voltage of the charging FET and the discharging FET when the second high level voltage is applied as a gate voltage.

* * * * *